(12) United States Patent
Ho et al.

(10) Patent No.: US 6,500,266 B1
(45) Date of Patent: Dec. 31, 2002

(54) HEATER TEMPERATURE UNIFORMITY QUALIFICATION TOOL

(75) Inventors: Henry Ho, San Jose, CA (US); Alexander M. Rubinchik, San Jose, CA (US); Aihua Chen, Fremont, CA (US); Abril C. Cabreros, Gilroy, CA (US); Steven T. Li, Cupertino, CA (US); Mark Yam, Monte Sereno, CA (US); Bruce W. Peuse, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/484,483

(22) Filed: Jan. 18, 2000

(51) Int. Cl.[7] .......................... C23C 16/00; C23C 16/52
(52) U.S. Cl. ...................... 118/730; 118/666; 118/696; 118/697; 118/715; 118/725
(58) Field of Search ................................ 118/715, 725, 118/730, 666, 696, 697

(56) References Cited

U.S. PATENT DOCUMENTS

| | | | | |
|---|---|---|---|---|
| 5,273,588 A | * | 12/1993 | Foster et al. ............. | 118/723 E |
| 5,294,778 A | * | 3/1994 | Carman et al. ............. | 219/385 |
| 5,329,732 A | * | 7/1994 | Karlsrud et al. ................ | 7/994 |
| 5,421,892 A | * | 6/1995 | Miyagi ........................ | 118/715 |
| 5,487,127 A | * | 1/1996 | Gronet et al. ................ | 392/416 |
| 5,708,755 A | * | 1/1998 | Gronet et al. ................ | 392/416 |
| 5,715,361 A | * | 2/1998 | Moslehi ........................ | 392/416 |
| 5,840,125 A | * | 11/1998 | Gronet et al. ................ | 118/730 |
| 5,937,142 A | * | 8/1999 | Moslehi et al. ............. | 392/416 |
| 6,090,210 A | * | 7/2000 | Balance et al. ............. | 118/725 |
| 6,222,161 B1 | * | 4/2001 | Shirakawa et al. .......... | 219/390 |
| 6,359,264 B1 | * | 3/2002 | Schaper et al. ........... | 219/444.4 |

OTHER PUBLICATIONS

Albert S. Tenney III, "Industrial Radiation Thermometry", Reprint from Mechanical Engineering, Leeds & Northrup Company, 7 pgs.
B.S. Myerson, "Silicon:Germanium Heterojunction Bipolar Transistors; From Experiment to Technology", Selected Topics in Electronics and Systems–vol. 2, pp. 367–385.
"Ferrofluidic Vacuum Rotary Feedthroughs," Ferrofluidics Corporation (1996), pp. 1–14.

* cited by examiner

*Primary Examiner*—Jeffrie R. Lund
(74) *Attorney, Agent, or Firm*—Blakely Sokoloff Taylor & Zafman

(57) ABSTRACT

An apparatus of a reactor or processing chamber comprising a chamber having a resistive heater disposed within a volume of the chamber, including a stage having a surface area to support a substrate such as a wafer and a body including at least one heating element, a shaft coupled to the body, a plurality of temperature sensors coupled to the chamber, each configured to measure a temperature at separate points associated with the surface area of the stage, and a motor coupled to the shaft and configured to rotate the resistive heater about an axis through the shaft. In this manner, the temperature sensors may measure a temperature at separate points of the surface area of the stage. A method of rotating a shaft and measuring a plurality of temperatures over the surface area of the stage or over a wafer seated on the stage with the plurality of temperature sensors.

25 Claims, 16 Drawing Sheets

HEATER TEMPERATURE UNIFORMITY QUALIFICATION TOOL

BACKGROUND OF THE INVENTION

1. Field of the Invention

The invention relates to the fabrication of integrated circuits and, more particularly, to process parameter uniformity within an environment for fabricating integrated circuits.

2. Background

High density integrated circuits, such as very large scale integration (VLSI) devices are typically formed on semiconductor substrates or wafers by subjecting the wafers to a number of deposition, masking, doping, and etching processes. In a typical single-wafer processing chamber or reactor, a wafer is placed onto a stage or susceptor within a process chamber and process gases are delivered into the chamber onto the wafer to perform the various deposition and etching steps. Chemical vapor deposition (CVD), for example, is a common process for depositing various types of films on substrates or wafers. In typical CVD processing, a wafer is placed in a deposition or reaction chamber and reactant gases are introduced into the chamber and are decomposed and reacted at a heated surface to form a thin film on the wafer. For example, one CVD process involves delivering silane ($SiH_4$) and ammonia ($NH_3$) into a process chamber while applying resistive or radiant heat to form silicon nitride on a wafer.

One consideration in semiconductor processing, including the fabrication of integrated circuits on a wafer, is the application of process gases in a uniform and controlled manner across the wafer's entire surface. This consideration is important in the fabrication of VLSI devices since a large number of processing steps are generally performed in sequence. A wafer may be comprised of dozens of areas designated as similar or identical chips or devices. Process parameter uniformity is therefore important to reliably make a chip on one portion of an area of a wafer similar to another chip on another area portion of the wafer.

The deposition rate, thickness, and uniformity of films formed on a wafer may depend on a variety of parameters such as the pressure or the temperature in the chamber, or the amount and type of gas and flow rate of gas across the wafer introduced into a chamber. Additionally, increasing a parameter such as temperature may affect another parameter such as pressure. For example, using a higher temperature generally allows for a higher pressure to be used.

In low pressure CVD (LPCVD) reactions, temperature uniformity is generally important. The surface reaction associated with a CVD process can generally be modeled by a thermally activated phenomenon that proceeds at a rate, R, given by the equation:

$$R = R_o e^{[-E_a/kT]}$$

where $R_o$ is the frequency factor, $E_a$ is the activation energy in electron volts (eV), and T is the temperature in degrees Kelvin. According to this equation, the surface reaction rate increases with increasing temperature. In a LPCVD process such as a $Si_3N_4$ deposition, the activation energy ($E_a$) is generally very high, on the order of 0.9–1.3 eV. Accordingly, to obtain a uniform thickness across the wafer, the temperature uniformity across the wafer should be tightly controlled, preferably on the order of ±2.5° C. or less for temperatures around 750° C.

One common heating scheme in CVD systems is a resistive heating scheme. A resistive heating scheme in a single-wafer chamber generally incorporates the resistive heating element directly in the stage or susceptor that supports the wafer in the chamber. In this manner, the reaction produced during the deposition may be generally more localized at the wafer. The heating element is typically a thin layer of conductive material, such as a thin coiled layer (about 2 mils) of a molybdenum (Mo) material formed in a single plane of the body of the susceptor. This design may be described as a "single-zone resistive heater," the "zone" description referring to the location of the heating element in a single plane in the body of the stage or susceptor. The CVD reaction in which the resistive heaters are used typically has a temperature compatibility to approximately 550° C. At higher temperatures, e.g., 750° C., temperature uniformity becomes problematic. One reason is that heat loss in a resistive heater increases with higher temperatures, particularly at the edges of the stage or susceptor. Single-zone resistive heaters typically do not have the ability to compensate for differences in heat loss across the stage or susceptor.

A second problem with single-zone resistive heaters such as described above and temperatures of 750° C. is localized heating. At high temperatures, single-zone heaters exhibit concentrated localized heating associated with high density power applied to the heating element at a localized area. Consequently, temperature uniformity is affected. A third problem with single-zone resistive heaters is that variations in manufacturing of the heating element can cause fluctuations in performance of a heating element which can lead to non-uniformity. The single-zone heater cannot be adjusted to compensate for the manufacturing variation. Further, at high temperature operation, single-zone heaters have shorter lifetimes due to the high power density applied at the power terminals and to the heating elements.

What is needed is a heating scheme for a processing chamber compatible with high temperature operation, e.g., on the order of 700° C. or greater, that achieves high temperature uniformity localized at a reaction site. What is also needed is a mechanism for evaluating the temperature uniformity of a reaction chamber or a heater within a reaction chamber.

SUMMARY OF THE INVENTION

An apparatus, a method, and a system are disclosed. In one embodiment, the apparatus is a reactor or processing chamber comprising a chamber having a resistive heater disposed within a volume of the chamber. The resistive heater includes a stage having a surface area to support a substrate such as a wafer and a body including at least one heating element. The resistive heater also includes a shaft coupled to the body. The reactor includes a plurality of temperature sensors coupled to the chamber, each configured to measure a temperature at separate points associated with the surface area of the stage. Finally, the reactor includes a motor coupled to the shaft and configured to rotate the resistive heater about an axis through the shaft. In this manner, the temperature sensors may measure a temperature at separate points of the surface area of the stage. In one embodiment, the temperature sensors are aligned such that as the stage rotates 360°, the temperature sensors can read individual points defining concentric circles of the area of the stage or a wafer seated on the stage. Based on this data, a temperature map can be generated to show the temperature uniformity of the heater.

In an embodiment of the method of the invention, a reactor such as described is provided. The shaft is rotated and a plurality of temperatures are measured over the surface area of the stage or over a wafer seated on the stage with a plurality of temperature sensors. In this manner, the temperature uniformity of the resistive heater may be evaluated by, for example, generating a temperature map and comparing the temperature map with a desired map profile. Thus, the invention provides, in one embodiment, a tool to evaluate the temperature uniformity capability of the heater. By improving the temperature uniformity, the film formation on a wafer formed utilizing the heater may be improved.

Additional features, embodiments, and benefits will be evident in view of the figures and detailed description presented herein.

BRIEF DESCRIPTION OF THE DRAWINGS

FIG. 14 shows a second plot of temperature measurements measured about a circumference of a wafer on the surface of a heater in accordance with an embodiment of the invention.

DETAILED DESCRIPTION OF THE INVENTION

Figure 1:
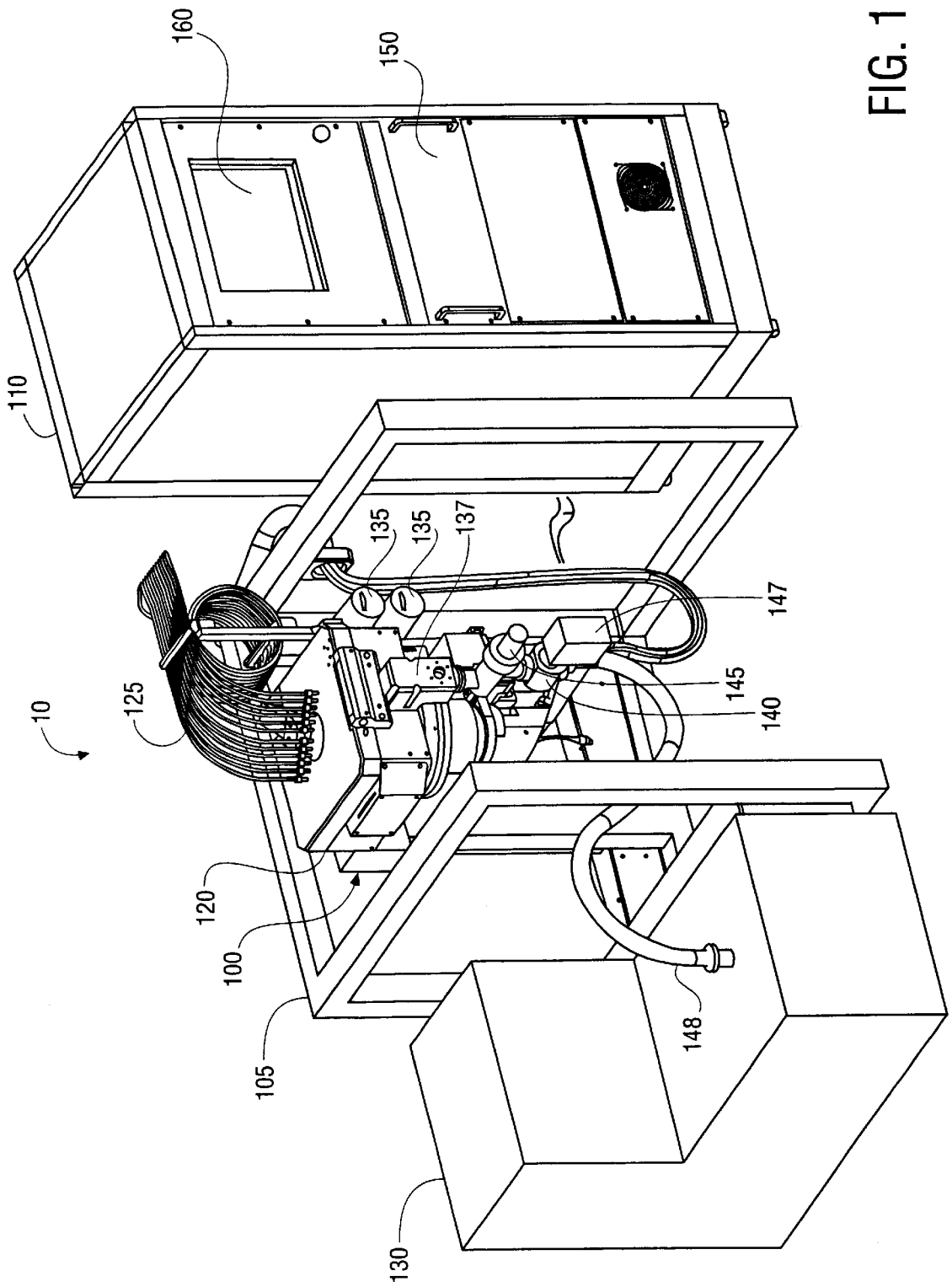
FIG. 1 is a top perspective view of components of a system including a processing chamber and a controller in accordance with an embodiment of the invention.

The invention generally relates to embodiments of a reactor or processing chamber, a system for a reactor, and a method of measuring temperature in a reactor. In one aspect, the invention utilizes a heater suitable for supporting a single-wafer (e.g., a semiconductor wafer) on a stage or susceptor in the reaction chamber. In one embodiment, the heater is a multi-zone resistive heater that includes at least two heating elements to supply the reaction temperature of the surface of the stage (and of a wafer on a stage). Such a multi-zone heater is described in detail in U.S. patent application Ser. No. 09/314,845, titled "Multi-Zone Resistive Heater," filed May 19, 1999, and assigned to Applied Materials, Inc. of Santa Clara, Calif., which is incorporated herein by reference. In one embodiment, the heater includes two heating elements, each heating element aligned in a distinct plane in the susceptor of the heater. Each heating element is coupled, in one embodiment, to a power source and the resistance of each heating element is varied across an area of the stage. The temperature associated with different areas of the surface of the susceptor or at the wafer (e.g., the center versus the edges) are separately controlled by the heating elements. By controlling the individual heating elements of such a heater, factors such as heat loss and pressure changes in the reactor are accommodated and improved temperature uniformity is achieved even at temperatures of 700° C. or greater.

It has been determined that a multi-zone resistive heater offers improved temperature uniformity across the surface of a wafer as compared to single-zone resistive heaters. Nevertheless, there is a need to verify the capabilities of a multi-zone resistive heater, as well as a single-zone resistive heater, prior to its use in a film-formation system such as a CVD processing system. The invention described herein offers a way to evaluate the temperature uniformity of a resistive heater (e.g., single-zone or multi-zone resistive heater) and qualify such heater for use in a film-formation system. By providing a tool to evaluate the uniformity capability of the heater, the invention offers the chamber manufacturer or system user the ability to select a heater that provides optimum uniformity for a desired process.

The accompanying FIGS. 1–6 show various illustrations of a system or a portion of a system of the invention useful, in one aspect, in evaluating the temperature uniformity of a resistive heater according to the invention. Such a system may be used, for example, in evaluating a resistive heater for a CVD process, including an LPCVD process for the deposition of films on a wafer or substrate. In the embodiment described, the system is a tool for evaluating the temperature uniformity of a resistive heater in a processing chamber is described. Accordingly, the system is utilized to evaluate and qualify resistive heaters for use in processing chambers that might be used, for example, in a CVD process environment. The embodiment described is generally not intended for use as a processing chamber introducing films on a substrate as part of chip or device fabrication unit. It is to be appreciated, however, that the system can, if desired, be adapted for such use. In the embodiment described, for example, typical process conditions are simulated with a wafer inside the chamber. However, process gases that would otherwise form a film on the wafer under such conditions are not introduced into the processing chamber. One adaptation that would be useful in converting the described system for use in a film-formation system would be to introduce such process gases into the chamber.

FIG. 1 illustrates a top perspective view of a system according to the invention. System 10 includes reactor or a processing chamber 100 coupled to a processor to control the operation of the processing chamber. In FIG. 1, processing chamber 100 is seated in stand 105 for support. Processing chamber 100 includes chamber lid 120 having a plurality, in this case 12, temperature sensors inserted therein to measure the temperature inside processing chamber 100. In one embodiment, temperature sensors are pyrometers 125 commercially available from Sekidenko, Inc. of Vancouver, Wash. The number of pyrometers 125 is selected, in this embodiment, to sufficiently encompass the area of a wafer placed inside processing chamber 100 given the effective area of measurement of each pyrometer.

FIG. 1 shows controller housing 110 including controller 150 and screen 160, such as a cathode ray tube (CRT) or other display screen. Screen 160 is, for example, a touch-type screen that allows a user of system 10 to control the operating parameters of processing chamber 100 including the temperature sensing requirements of pyrometers 125. Screen 160 is coupled to controller 150.

In this embodiment, a system controller is employed to handle the control tasks associated with system control. Controller 150 may be configured to record the temperature measured by pyrometers 125 and control the power supplied to a heating element(s) within processing chamber 100 based, for example, on an algorithm that determines a relative value of the temperature difference and adjusts the heating element(s) accordingly. Controller 150 is also coupled to pressure indicators 135 that measure the pressure in the chamber. Vacuum source 130 is coupled to processing chamber 100 at exhaust port 137. Throttle valve 140 and gate valve 145, along with step motor 147, are controlled by controller 150 to establish and maintain a desired chamber volume pressure. Controller 150 may also be configured to control the flow of gases to processing chamber 100. Controller 150 is also coupled to a user interface (e.g., screen 160) that allows an operator to enter the reaction parameters, such as the desired reaction temperature, the reaction pressure, and the flow of gases to processing chamber 100.

Control signal generation logic is supplied to controller 150 in the form of, for example, software instruction logic that is a computer program stored in a computer-readable medium such as the memory of the controller. The computer program includes sets of instructions that dictate the timing, introduction of gases, chamber pressure, heater temperature, heater temperature ramping rate, proportional-integral-derivative (PID) control stabilization of temperature and other parameters of a particular process. It is to be appreciated that other computer programs such as one stored on another memory device, including but not limited to, a floppy disk, may also be used to operate the system controller.

The computer program code is written in a computer-readable programming language such as, for example, C, C++, or others. Suitable program code is generally entered into a single file or multiple files using a text editor. If the entered code text is in a high level language, the code is compiled, and the resultant compiler code is then linked with an object code or precompiled object code, the system invokes the object code, causing the computer system to load the code in memory, from which the central processing unit reads and executes the code to perform the task identified in the program.

Figure 2:
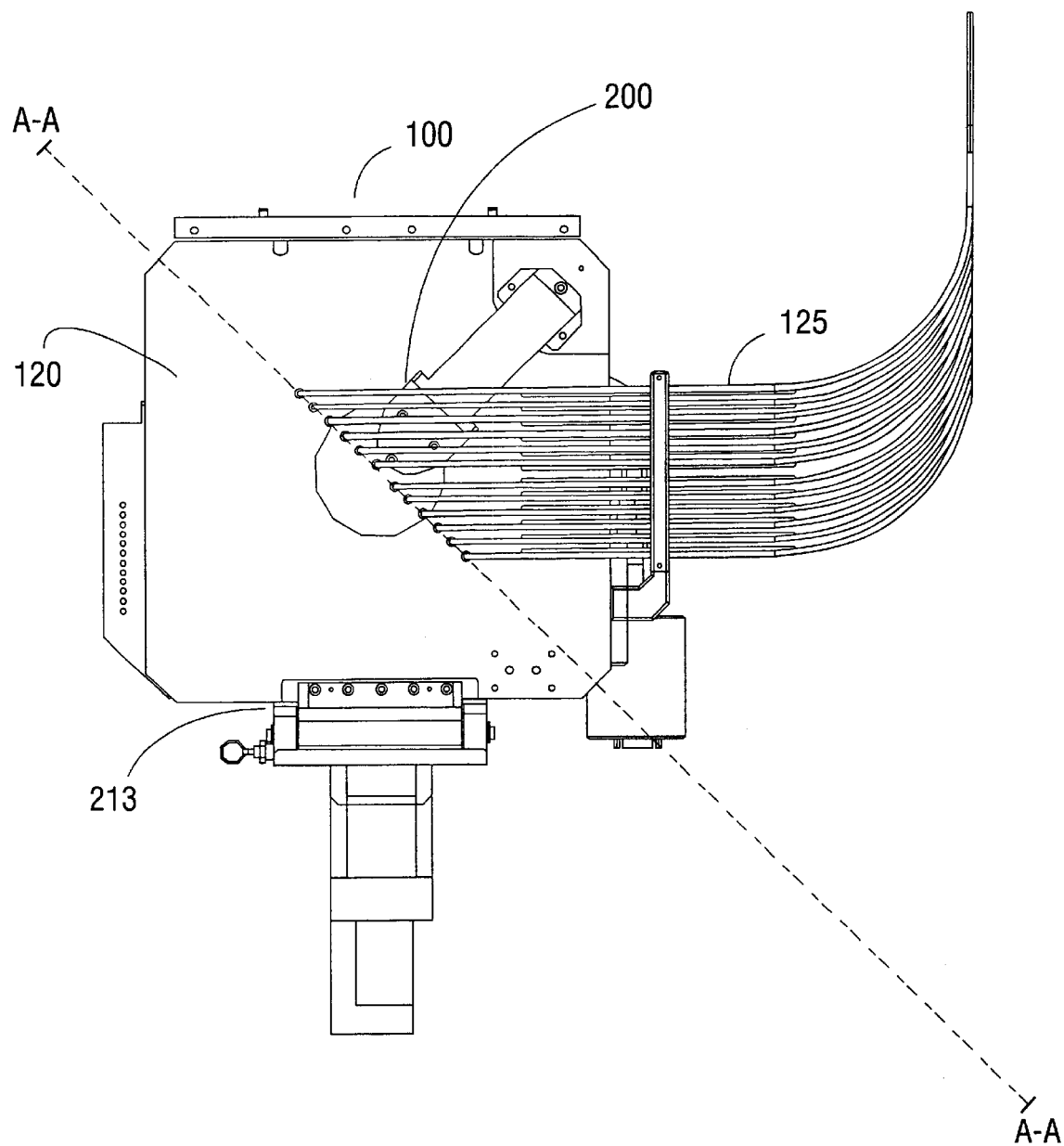
FIG. 2 is a top planar view of a portion of the processing chamber of FIG. 1.

FIG. 2 shows a planar top view of a portion of processing chamber 100. FIG. 2 shows pyrometers 125 located in chamber lid 120 as described above. Pyrometers 125 are aligned in a diagonal row collectively having a diameter corresponding with a significant portion of a typical diameter of a wafer. A typical wafer has a diameter of approximately 8 inches. In one embodiment, for example, each pyrometer occupies a diameter of approximately 0.3 inches and is spaced about 0.6 inches apart along the diagonal.

Figure 3:
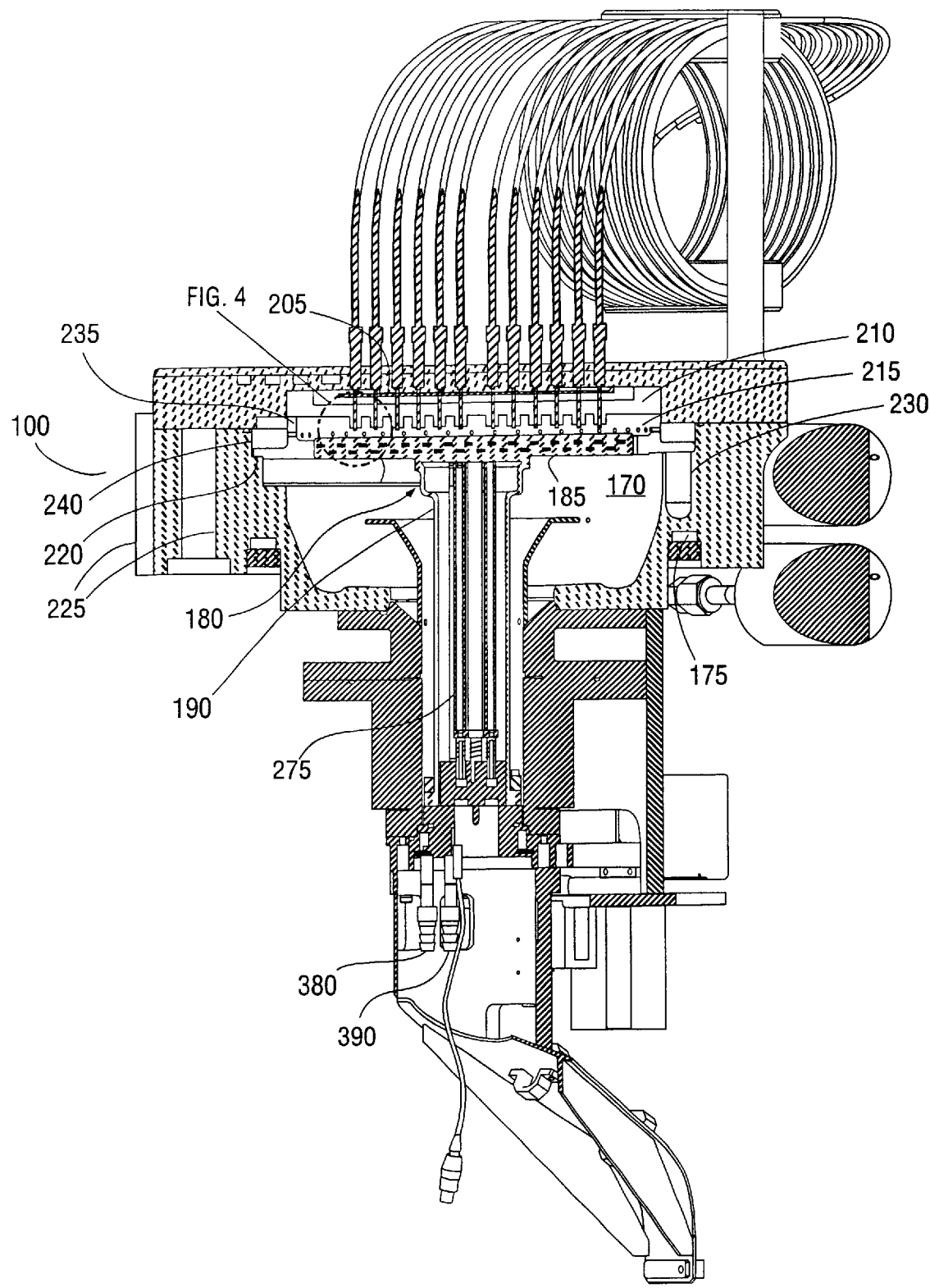
FIG. 3 is a cross-sectional view of the processing chamber taken through lines A—A of FIG. 2.

FIG. 3 shows a cross-section of processing chamber 100 through diagonal line A—A of FIG. 2. In this embodiment, processing chamber body 225 is constructed of materials such that a pressure of greater than or equal to 100 Torr can be maintained.

FIG. 3 shows processing chamber body 225 that defines reaction chamber volume 170 in which the interaction between a process gas and a wafer takes place (e.g., a CVD reaction). Processing chamber body 225 is constructed, in one embodiment, of aluminum and has passages 175 for water or other cooling liquids to be pumped therethrough to cool processing chamber body 225 (e.g., a "cold-wall" reaction chamber). Resident in reaction chamber volume 170 is resistive heater 180 including, in this view, susceptor or stage 185 supported by shaft 190. Stage 185 has a surface area sufficient to support a substrate such as a semiconductor wafer. Process gas enters otherwise sealed chamber volume 170 through gas distribution port 200 in a top surface of chamber lid 120 of processing chamber body 225 (see FIG. 2). The introduced process gas goes through blocker plate 205 to distribute the gas about an area consistent with the surface area of a wafer. Thereafter, the process gas is distributed through perforated face plate 210 located, in this view, above resistive heater 180 and coupled to chamber lid 120 within chamber volume 170. One objective of a combination of blocker plate 205 with face plate 210 is to create a uniform distribution of process gas about the surface of a wafer. A detailed description of a chamber incorporating a blocker plate and a face plate and directing process gases to a processing chamber is described in detail in U.S. patent application Ser. No. 09/350,817, titled "Method and Apparatus for Directing Constituents Through Processing Chamber," filed Jul. 9, 1999 and assigned to Applied Materials, Inc. of Santa, Clara, Calif., incorporated herein by reference.

A substrate such as a wafer is placed in a reaction portion of chamber volume 170 on stage 185 of heater 180 by opening chamber lid 120 and exposing a top surface of stage 185. In one embodiment, chamber lid 120 is hinged through hinge 213 to processing chamber body 225 (see FIG. 2). Raising chamber lid 120 at hinge 213 from processing chamber body 225 also raises blocker plate 205 and face plate 210 that are coupled to the chamber-side surface of chamber lid 120.

Heater 180 is, in this embodiment, positioned in chamber volume 170 in a "wafer-process" position to support a wafer on stage 185 at a location for interaction with a process gas. Heater 180 is positioned in chamber volume 170 such that when a wafer is placed on the surface of stage 185, the wafer is a short distance (e.g., 400–700 mils) from face plate 210.

Process gas flows into chamber volume 170 through gas distribution port 200, through blocker plate 205 and perforated face plate 210. Under process conditions, process gas typically contacts a wafer on a surface of stage 185 to introduce a film on the wafer. In one embodiment of the invention, the process gas is an inert gas such as nitrogen as no film-formation on a wafer inside chamber volume 170 is desired. The inert gas is introduced to simulate desired film-formation conditions by, for example, establishing a desired chamber pressure. The pressure is measured by one or more pressure gauges, such as Baretron® pressure gauges commercially available from MKS Instruments, Inc. of Andover, Mass. In one embodiment, the pressure in chamber volume 170 is established and maintained by throttle valve 140 coupled to vacuum source 130. In a further embodiment, throttle valve 140 and vacuum source 130, controlled by controller 110, maintain pressure of a level of equal to or greater than 100 Torr. A suitable mid-level pressure range is approximately 100–300 Torr. It is to be appreciated, that the pressure in chamber volume 170 will generally be determined based on the desired reaction conditions.

In one embodiment of the invention, the process gas flows through blocker plate 205 and face plate 210 which create a shower-head like cascade of the process gas over a surface of a wafer on the surface of stage 185. As gas is introduced in chamber volume 170, gas is also removed so that a predetermined pressure may be maintained during processing. In the configuration of the chamber shown in FIG. 1, gases are removed through exhaust port 137 of the chamber and pumped out at one side through vacuum pump-out 148 to vacuum source 130.

Referring to FIG. 3, in one embodiment of the invention, pumping plate 215 is provided to direct the flow of gases in chamber volume 170. Pumping plate 215, having an opening therethrough, rests on ledge 220 of chamber body 225. An underside of pumping plate 215 and inner chamber portion 220 define channel 230 extending circumferentially around chamber volume 170. Exhaust port 137 is linked to channel 230 to discharge gases from chamber volume 170.

As shown in FIG. 3 pumping plate 215 includes, in this view, vertical annular step portion 235 that forms a circumferential, longitudinal or vertical wall to pumping plate 215. Annular step portion 235 is recessed from the edge of pumping plate 215 to define channel 240 between face plate 210, processing chamber body 225, and pumping plate 215.

Figure 4:
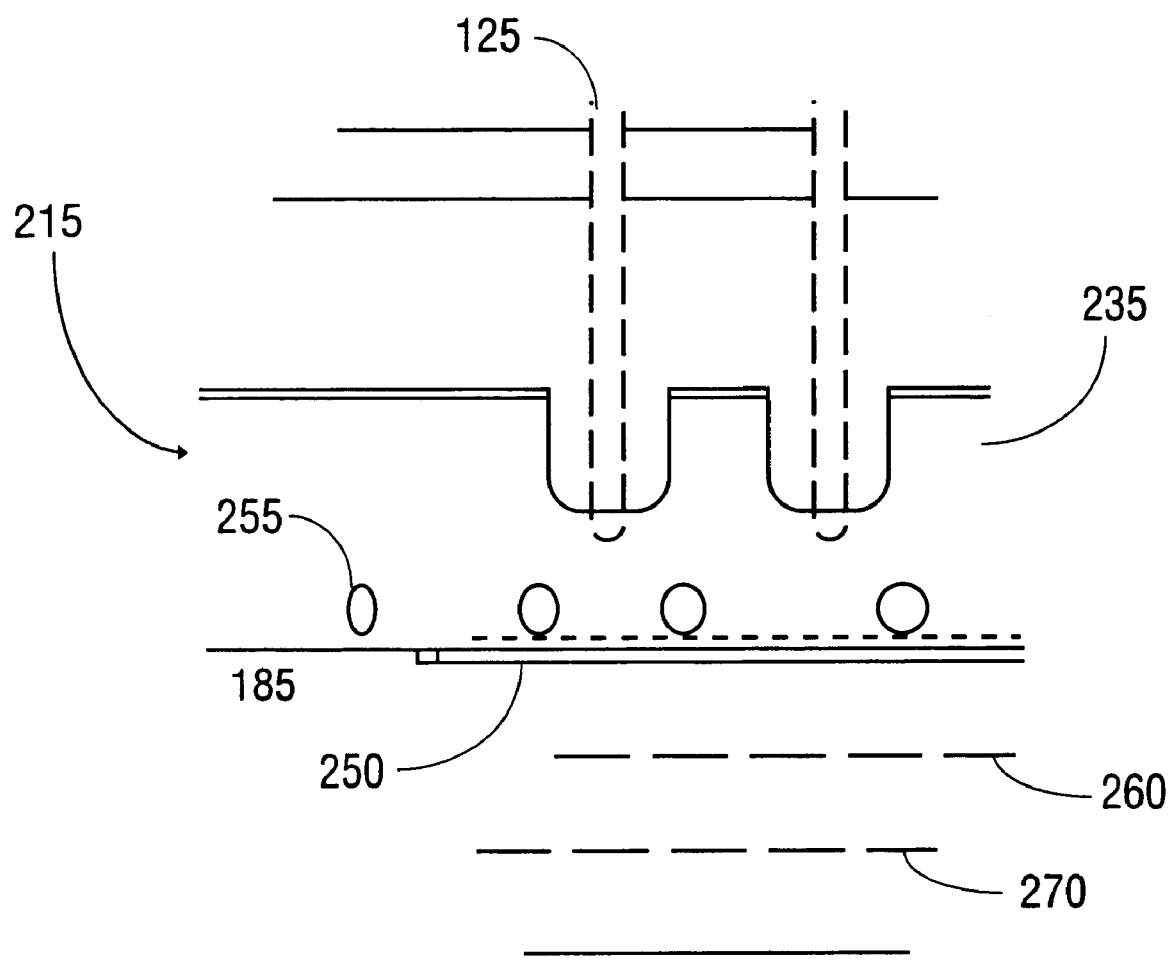
FIG. 4 is a magnified view of a portion of the processing chamber illustrated in FIG. 3 including a magnified view of the pumping plate inside the chamber.

FIG. 4 shows an exploded view of a portion of processing chamber 100 of FIG. 3 including pumping plate 215. Specifically, FIG. 4 shows a portion of annular step portion 235 of pumping plate 215. In this view, a base of pumping plate 215 is substantially aligned with the surface of stage 185 with annular step portion 225 surrounding stage 185. A wafer (shown in dashed lines) is configured to be seated in wafer pocket 250 in a top surface of stage 185. A plurality of through holes 255 in annular step portion 235 communicate process gas between an area directed at the top surface of the wafer and channels 240 and 230. A detailed description of a similar pumping plate and the flow of gases is provided in U.S. patent application Ser. No. 09/350,817, titled "Method and Apparatus for Directing Constituents Through Processing Chamber," filed Jul. 9, 1999, which is incorporated herein by reference.

As shown in FIG. 3 and FIG. 4, pyrometers 125 extend through chamber lid 120, through blocker plate 205 and through face plate 210. Pyrometers 125 extend into an inner annular region created by annular step portion 235 of pumping plate 215. In this manner, pyrometers 125 are positioned proximally adjacent a wafer seated within pocket 250 of stage 185. A typical distance of pyrometers 125 from a wafer is 1.5 to 6 millimeters (mm).

In one embodiment, the components of processing chamber 100 are suitable for operation at wafer temperatures as high as 700° C. or more and more preferably at temperatures as high as 750° C. or more. In a typical processing environment, a temperature at stage 195 is approximately 800° C. to maintain a wafer temperature of 750° C. Accordingly, exposed components in chamber volume 170 are compatible with such high temperature processing. Such materials are also compatible with process gases and other chemicals, such as cleaning chemicals, that may be introduced in chamber volume 170. In one embodiment, exposed surfaces of resistive heater 180 are comprised of aluminum nitride (AlN). For example, susceptor or stage 185 and shaft 190 may be comprised of similar aluminum nitride material. Alternatively, the surface of stage 185 is comprised of high thermally conductive aluminum nitride material (on the order of 95 percent purity of a thermal conductivity from 140 W/mK to 200 W/mK) while shaft 190 is comprised of a lower thermally conductive aluminum nitride (on the order of 60 W/mK to 100 W/mK). Stage 185 of heater 180 is typically bonded to shaft 190 through diffusion bonding or brazing as such coupling will similarly withstand the environment of chamber volume 170.

Referring to FIG. 3 and FIG. 4, a multi-zone resistive heater is illustrated. In one embodiment, stage 185 includes two heating elements, first heating element 260 and second heating element 270 (illustrated in dashed lines). First heating element 260 and second heating element 270 are formed in distinct planes of the body of stage 185. Each heating element is made of a material with thermal expansion properties similar to the material of the stage. One material is molybdenum (Mo) which has a thermal expansion coefficient similar to aluminum nitride. In one embodiment, each heating element includes a thin layer (e.g., 2 mils) of molybdenum material in a coiled configuration.

As shown in FIG. 3, first heating element 260 and second heating element 270 are coupled to power terminals 275. Power terminals 275 extend in an inferior direction through a longitudinally extending opening through shaft 190 to a power source that supplies the requisite energy to heat the surface of stage 185. In one embodiment, a thermocouple extends through longitudinally extending opening through shaft 190 to a point just below the superior top surface of stage 185. In an embodiment where stage 185 is cylindrical, the thermocouple extends at a point corresponding approximately with the mid-point of the cylindrical body. Such a thermocouple is used, in one aspect, to ramp and control the heater to a desired temperature. A detailed description of a multi-zone resistive heater is described in U.S. patent application Ser. No. 09/314,845, titled "Multi-Zone Resistive Heater," filed May 19, 1999, which is incorporated herein by reference.

Figure 5:
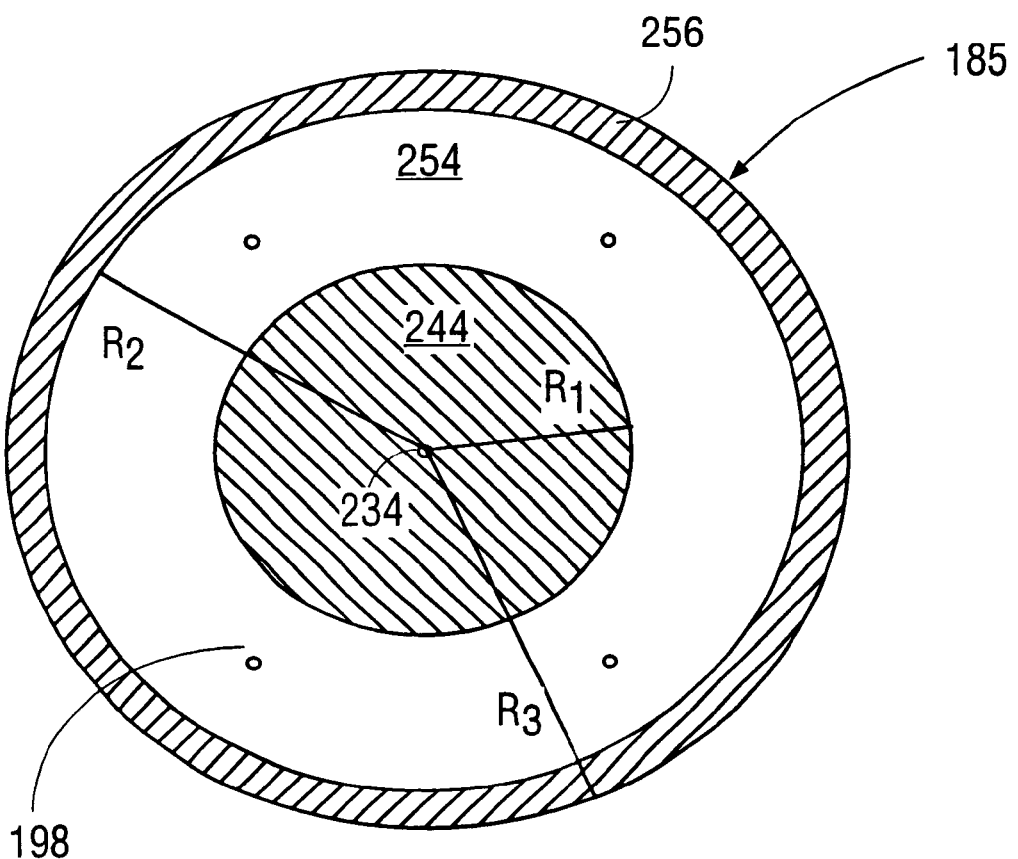
FIG. 5 is a top schematic view of the stage or susceptor of the heater illustrated in FIG. 3 showing three zones in accordance with an embodiment of the invention.

FIG. 5 shows a schematic top view of stage or susceptor 185. The surface of stage 185 is divided, in this example, into at least three zones. As shown in FIG. 5, area 244 forms a zone having an area defined by radius $R_1$. Area 244 is associated with an area of stage 185 above shaft 190. Area 254 forms a zone having an area defined by radius $R_2$ minus area 244 defined by radius $R_1$. Area 256 is associated with the edge of stage 185 and forms a zone having an area defined by radius $R_3$ minus area 254 defined by radius $R_2$ and area 244 defined by radius $R_1$. Area 256 includes an area of stage 185 surrounding pocket 245.

In one embodiment, first heating element 260 is disposed in a portion of the body of stage 185 at a position closer to the wafer-supporting surface of stage 185 than second heating element 270. In one embodiment, first heating element 260 and second heating element 270 have independent heat distribution and therefore may be controlled separately. In this manner, first heating element 260 may receive more or less power at certain points then certain points associated with second heating element 270. One way, first heating element 260 and second heating element 270 are separately controlled is by varying the width of each heating element across the area of stage 185 while keeping the thickness of the heating element generally constant. It is generally recognized that, for a resistive heater, the power supplied to the heating element, and thus the heat given off by the heating element, is directly related to the resistance in the heating element. For a resistive heating element having a constant thickness, a wider portion of the heating element (i.e., greater volume) will have less resistance, will require less power to move a current, and will give out less heat than a narrower portion of the heating element (i.e., smaller volume). Thus, by reducing the width of a heating element at certain points (i.e., reducing the volume of a heating element), the power supply to the heating element will be greater at those points to move an amount of current through the heating element than at points where the width of the heating element is not reduced. The temperature given off at the reduced point will similarly be greater than at points where the width of the heating element is not reduced. The power density, generally defined as the amount of power required to move an amount of current through a length of a heating element, will be greater at those portions of a heating element having a reduced width.

Referring to FIG. 5, in one example, a width of first heating element 260 in an area corresponding to area 244 is less than a second width corresponding to area 254 of stage 185 of heater 180. Current travelling through the smaller width portion of first heating element 260 will encounter a greater resistance than current travelling through other portions of heating element 260, and thus the heat given off by heating element 260 will be greater in area 244. In this manner, the power density of first heating element 260 is localized in area 244. Conversely, through the same principle, the power density of second heating element 270 is localized in an area corresponding to area 254.

Figure 6:
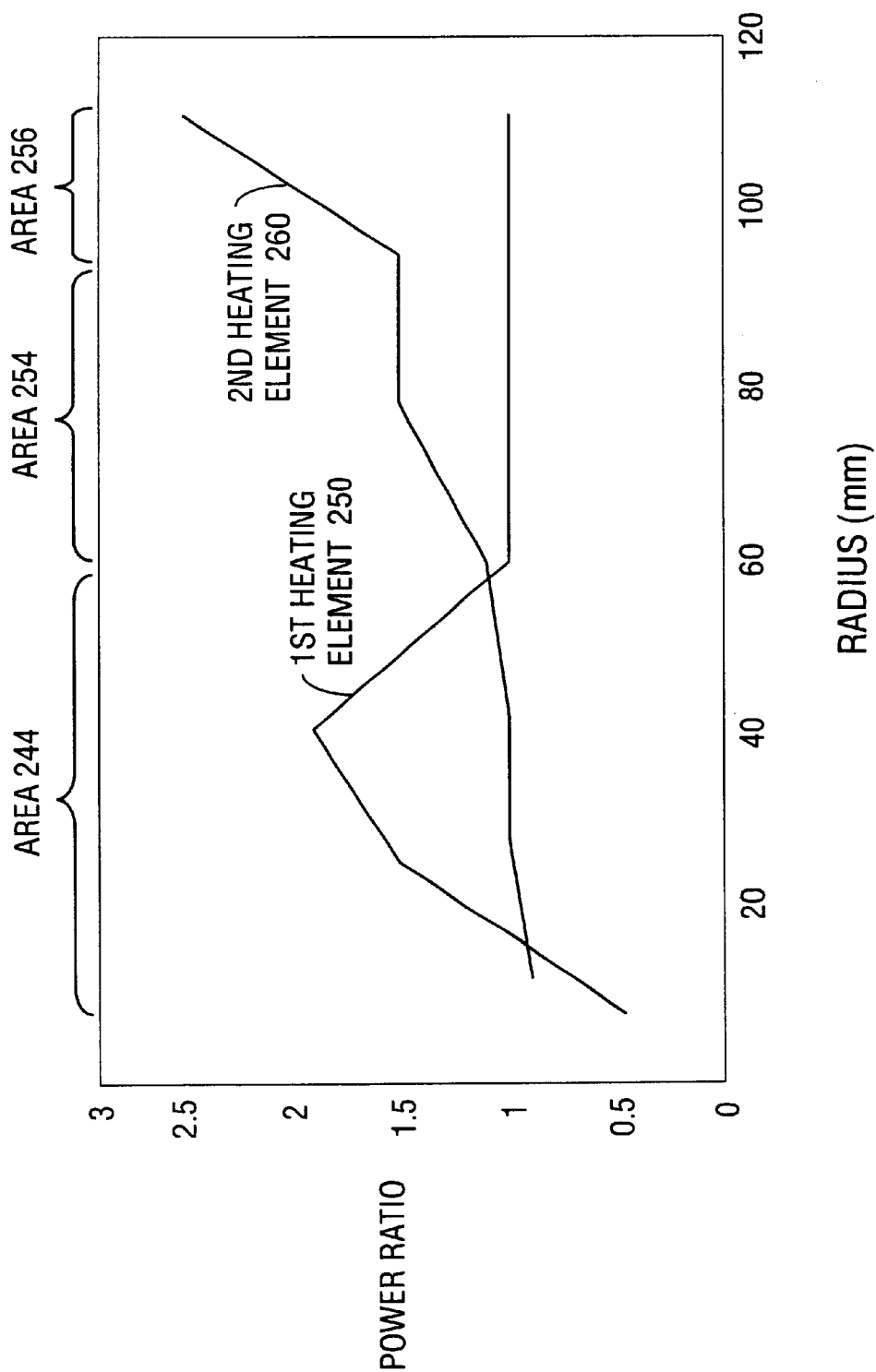
FIG. 6 is a graphical representation of the power ratio versus the stage or susceptor radius of the heater illustrated in FIG. 3 in accordance with an embodiment of the invention.

FIG. 6 graphically illustrates the individual control of the heating elements for a surface of stage 185 in heater 180. FIG. 6 shows the power ratio supplied to first heating element 260 and second heating element 270 versus the radius of stage 185. The power ratio is defined in this embodiment as the ratio of the power of first heating element 260 and the power of second heating element 270. As indicated, the power ratio of first heating element 260 is greater in area or zone 244 than other zones of stage 185. Similarly, the power ratio is greater in area or zone 254 due to the additional power density associated with second heating element 270 in that area or zone.

Figure 7:
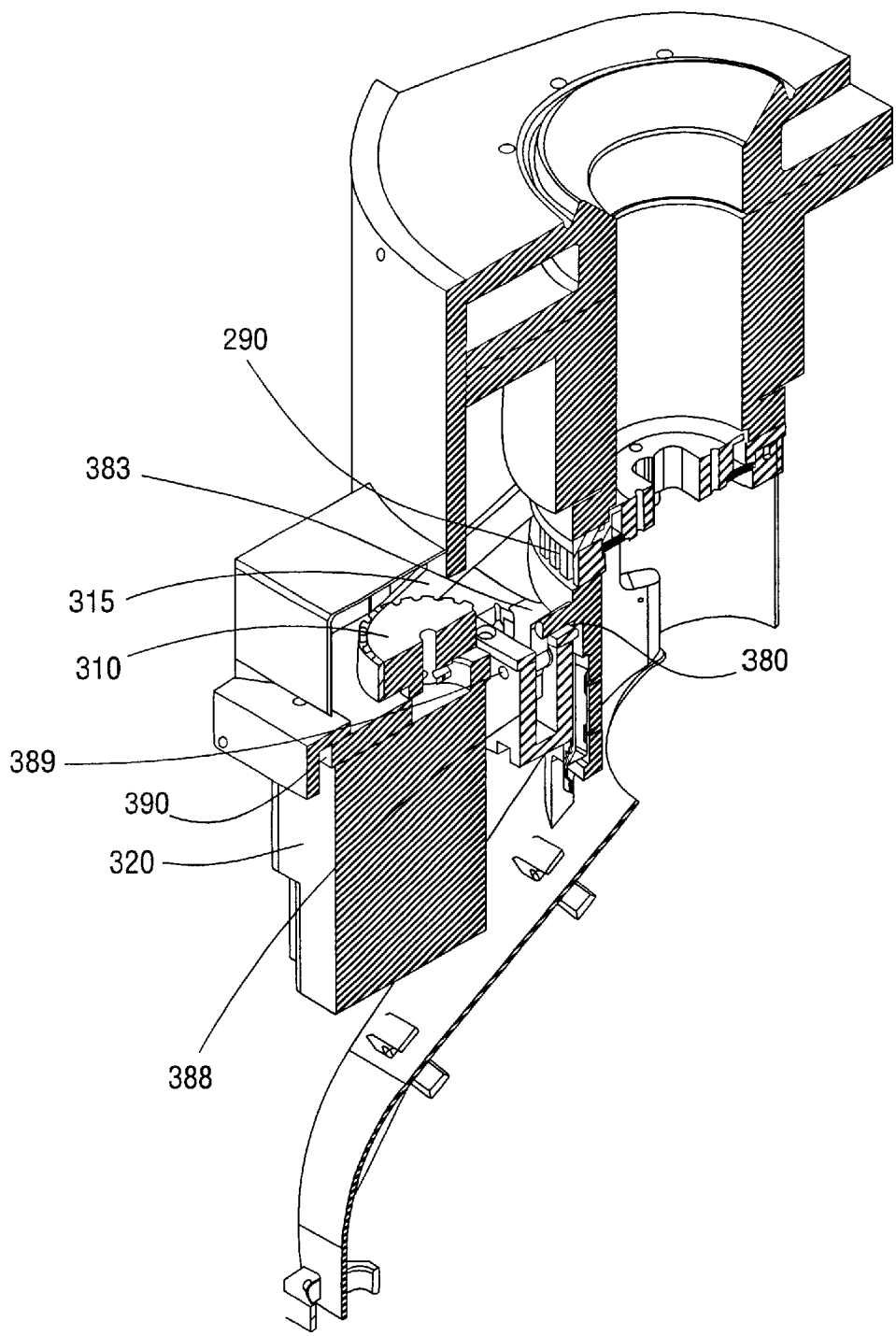
FIG. 7 is a top perspective cut-away view of a portion of the processing chamber of FIG. 1.
Figure 8:
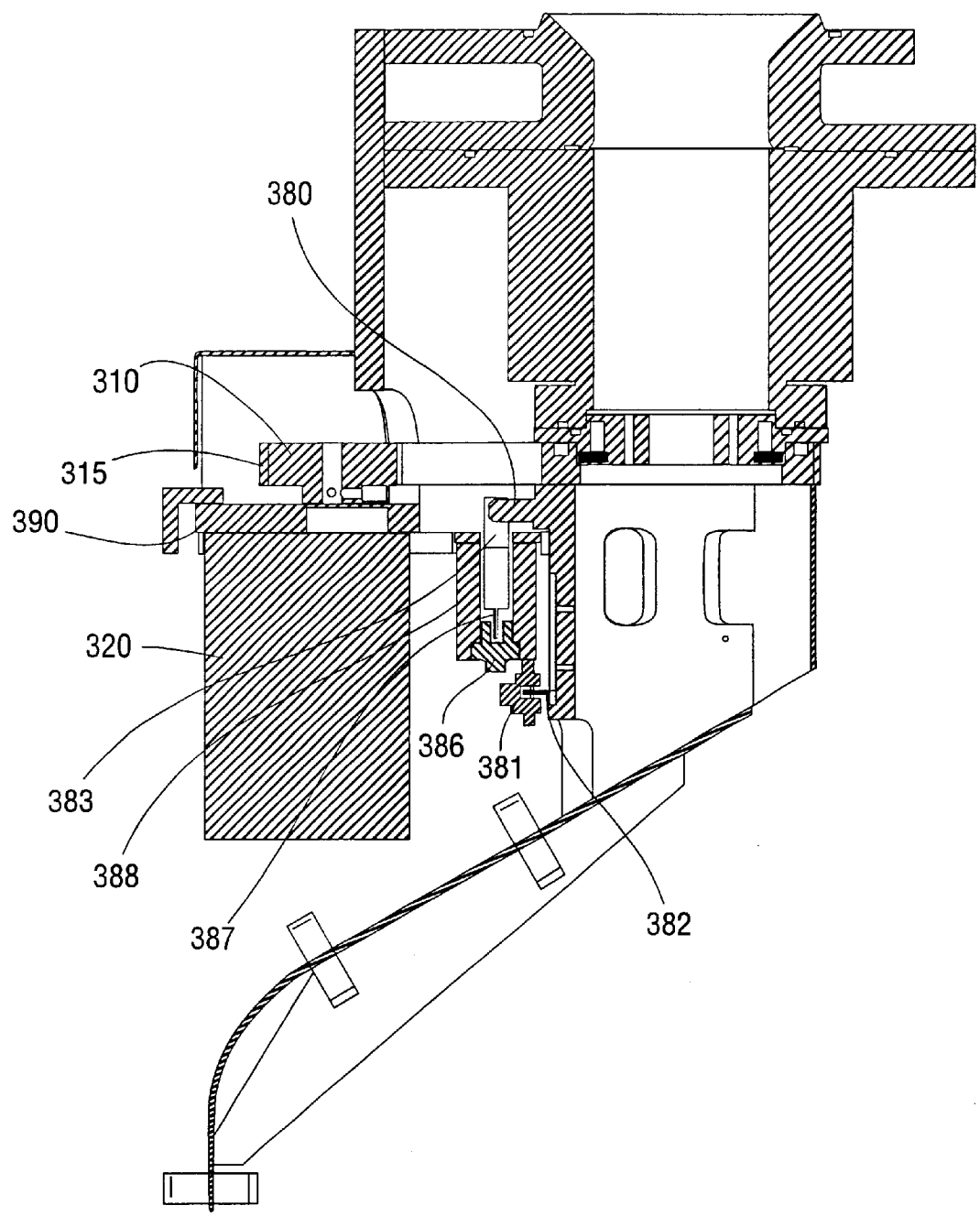
FIG. 8 is a planar side view of the portion of the processing chamber shown in FIG. 7.

FIG. 7 shows a top-perspective cut-away view of a portion of processing chamber 100 described above. FIG. 8 shows a planar side view of the same cut-away portion of processing chamber 100 as shown in FIG. 7.

FIG. 7 and FIG. 8 show an embodiment of a mechanism for rotating heater 180. In FIG. 7 and FIG. 8, certain components, including heater 180, are removed to illustrate certain other features of processing chamber 100. FIG. 7 and FIG. 8 show pulley ring 290 adapted to be coupled to shaft 190. Stepping motor 320 is coupled to processing chamber 100 and includes a shaft or gear head extending therefrom. The shaft or gear head is coupled to pulley ring 310 in a similar plane as pulley ring 290. Pulley belt 315 extends between pulley ring 290 and pulley ring 310. In one embodiment, stepping motor has a 20:1 speed ratio whereby the motor turns 20 times for each turn of the shaft or gear head coupled to pulley ring 310. In one embodiment, pulley ring 290 has a circumference twice as large as pulley ring 310 to create a speed of two to one (i.e., a motor to pulley ring speed of 40:1). Pulley ring 290 has a diameter of 4.745 inches with 40 teeth, while pulley ring 310 has a diameter of 2.375 inches with 20 teeth. In this embodiment, stepping motor 320 rotates heater 180 in a circular direction controlled by controller 150.

Figure 9:
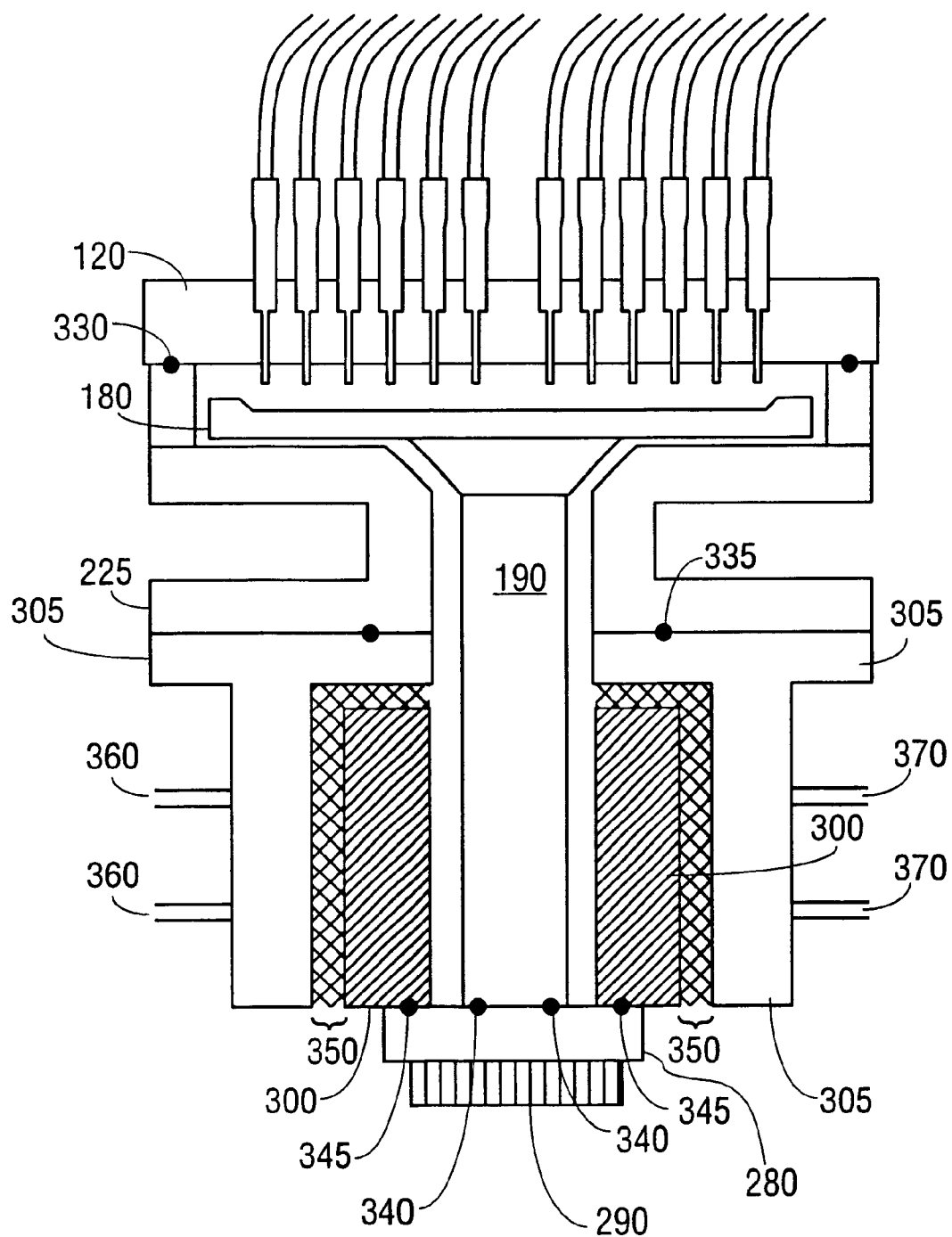
FIG. 9 is a schematic cross-section side view of the processing chamber of FIG. 1 illustrating sealing mechanisms associated with the chamber.

FIG. 9 shows a schematic cross-section of processing chamber 100, illustrating certain components of the chamber. In one embodiment, heater 180 is configured to be rotated such that pyrometers 125 can measure a plurality of points associated with a wafer surface. FIG. 9 shows heater 180 coupled at its base to hub 280. Hub 280 is coupled to shaft 190 such as by a mating thread coupling. Hub 280 is coupled to pulley ring 290 such as by bolt and nut coupling. Coupled at the base of hub 280 is a two-component rotary feedthrough structure. The rotary feedthrough structure includes inner portion 300 and outer portion 305. Inner portion 300 is configured to rotate with the rotation of heater 180 and hub 280. Outer portion 305 of the rotary feedthrough is configured to be stationary. One example of a suitable rotary feedthrough structure is Model No. HS-3000-SFFEW, commercially available from Ferrofluidics Corporation of Nashua, N.H.

In one embodiment, the processing chamber pressure is maintained at less than atmospheric pressure. In order to maintain such a vacuum throughout chamber volume 170, the individual components that define chamber volume 170 should be properly sealed. FIG. 9 illustrates one embodiment for maintaining a vacuum seal inside chamber volume 170. In FIG. 9, chamber lid 120 is coupled to chamber body 225 by O-ring 330. Heater 180 is coupled to hub 280 by O-ring 340. Similarly, outer portion 305 of the rotary feedthrough structure is coupled to chamber body 225 by O-ring 335. Hub 280 is coupled to inner portion 300 of the rotary feedthrough structure by O-ring 345. In each of the above couplings of components, the components may be coupled through an O-ring where the components do not move relative to one another. Each O-ring serves, in one sense, to seal the coupling and maintain the vacuum in the chamber. In the case of the rotary feedthrough structure, however, inner portion 300 rotates while outer portion 305 is stationary. To effectively seal volume 350 between inner portion 300 and outer portion 305 of the rotary feedthrough structure, the components are assembled with a minimum tolerance (e.g., minimum volume) between the components. A magnetic fluid, such as a ferrofluid, fills volume 350 to create the seal.

As described above, the processing temperature of forming a film on a wafer inside chamber volume 170 can approach 800° C. or more. In such instances, the components of the processing chamber are exposed to such high temperatures. As described above, chamber body 225 is cooled by a cooling liquid such as water pumped through processing chamber body 225. A second cooling system is also provided to cool the other components of processing chamber 100 which may also experience excessive heat. Thus, a cooling liquid is supplied to the rotary feedthrough structure through inlets 360 on one side of outer portion 305 and is expelled through outlets 370 on a second side of outer portion 305. A cooling liquid serves, in one aspect, to cool the rotary feedthrough structure thereby protecting magnetic fluid in volume 350. Additional cooling liquid is provided through inlet cooling tube 380 and outlet cooling tube 390 in hub 280 (see FIG. 3). Cooling tubes 380 and 390 provide protection, particularly to O-rings 340 and 345.

In one embodiment, heater 180 is configured to be rotated 360° (i.e., one revolution) by stepping motor 320 and then to return to its original position. Referring to FIG. 7 and FIG. 8, in one embodiment, sensors are included with processing chamber 100 to confirm the rotation. Home sensor 381 is, for example, a photoswitch associated with stepping motor 320 and confirms a rotation start position for stepping motor 320. Home flag 382 extends orthogonally from a side at the base of hub 280. In a start or "home" position, home flag 382 is aligned with home sensor 381 to open a circuit between the sensor. Processor 110 interprets the open circuit as a home position. As home flag 382 moves away from home sensor 381 with the rotation of heater 180, the photoswitch associated with home sensor 381 closes and signals processor 110 of the rotation of heater 180. Thus, home sensor 381 establishes a set starting point for stepping motor 320 in rotating heater 180 so that stepping motor 320 (and pulley ring 310) start from the same point.

FIG. 7 and FIG. 8 also illustrate one embodiment of a directional sensor. An inferior portion of hub 280 includes dowel pin 380 extending from a side portion. Coupled to motor mount 390 is sensor bracket 388. Pivotally coupled to the underside of sensor bracket 388 is directional flag 383 coupled at pivot point 389 to bisect directional flag 383 into upper and lower portions. Coupled to sensor bracket 388 at a location adjacent the lower portion of directional flag 383 is directional sensor 386. Directional sensor 386 is, for example, a photoswitch. In a "home" position, the lower portion of directional flag 383 is located within directional sensor 386 thus opening the circuit and alerting processor 110 that heater 180 has not rotated 360°. When heater 180 is rotated 3600 by stepping motor 320, dowel pin 380 contacts directional flag 383 and displaces directional flag 383 about pivot point 389. This displacement displaces directional flag 383 from its position within directional sensor 386, thus closing the circuit associated with the photoswitch. Processor 110 interprets the closed circuit as a 3600 rotation of heater 180. The rotation, in this embodiment, is completed and stepping motor 320 reverses its rotation direction to return heater 180 to the home position (with home sensor 381) notifying processor 110 of the home position. In this embodiment, directional flag 383 is weighted about its bottom portion such that when the force of pivot arm 380 is removed, directional flag 383 pivots about pivot point 389 back to its position within directional sensor 386.

Figure 10:
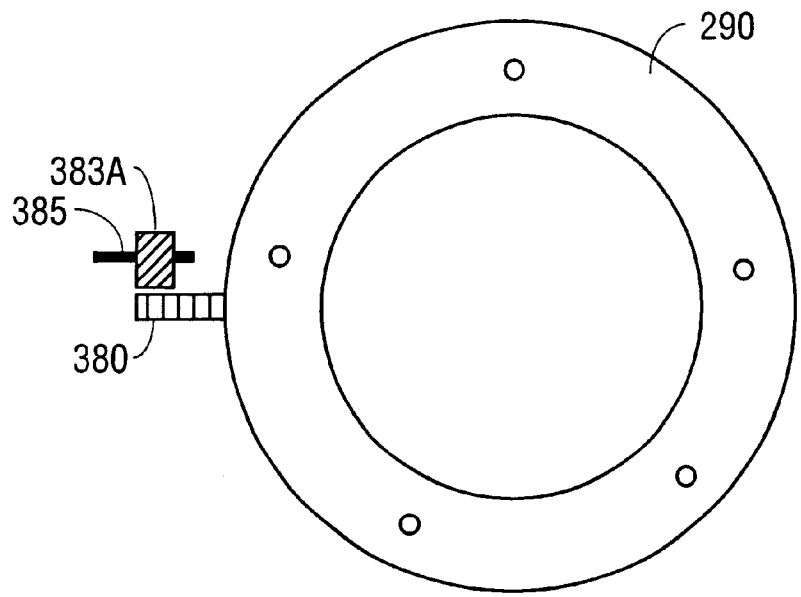
FIG. 10 is a bottom planar cut-away view of a pulley ring coupled to the base of the heater illustrated in FIG. 3 and a rotation sensor mechanism in a "home" position in accordance with an embodiment of the invention.
Figure 11:
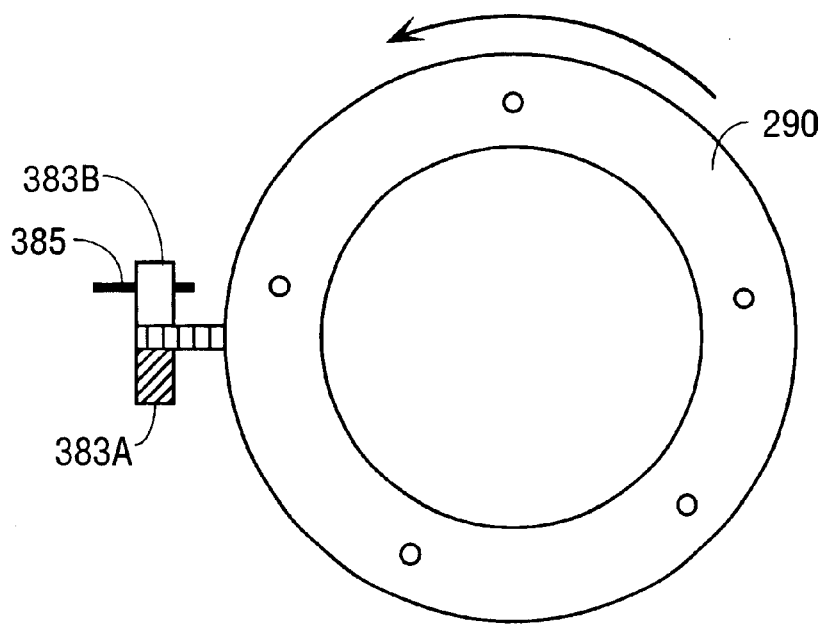
FIG. 11 shows the pulley-ring and sensor mechanism of FIG. 3 after a 360° rotation.

FIG. 10 and FIG. 11 schematically illustrate the operation of the directional sensor described above. FIG. 10 and FIG. 11 show bottom planar views of hub 280 before and after a 360° rotation of hub 280 (heater 180). FIG. 10 shows pulley ring 290 at a "home" point or "zero" point, prior to rotation. In this position, a first side of dowel pin 380 rests adjacent a side of top portion 383a of directional flag 383. In this position, bottom portion of 383b of directional flag 383 covers directional sensor 386 (not visible). In one embodiment, directional sensor 386 is a photoswitch, that is open when directional flag 383 is positioned over directional sensor 386.

FIG. 11 shows the system after hub 280 (heater 180) has rotated 360°. In this illustration, dowel pin 380 deflects top portion 383a of directional flag 383 about pivot point 385 so that bottom portion 383b of directional flag 383 is moved away from directional sensor 386 and exposes directional sensor 386 to close the circuit. Directional sensor 386 is coupled to processor 110. In this manner, when the circuit is closed, processor 110 receives a signal that hub 280 (heater 180) has rotated 3600. At this point, the rotation is complete, stepping motor 320 reverses the rotation to return hub 280 (heater 180) to the home position. The circuit opens and a corresponding signal is sent to processor 110. Home sensor 381 notifies processor 110 when hub 280 (heater 180) is in the home position.

Figure 12:
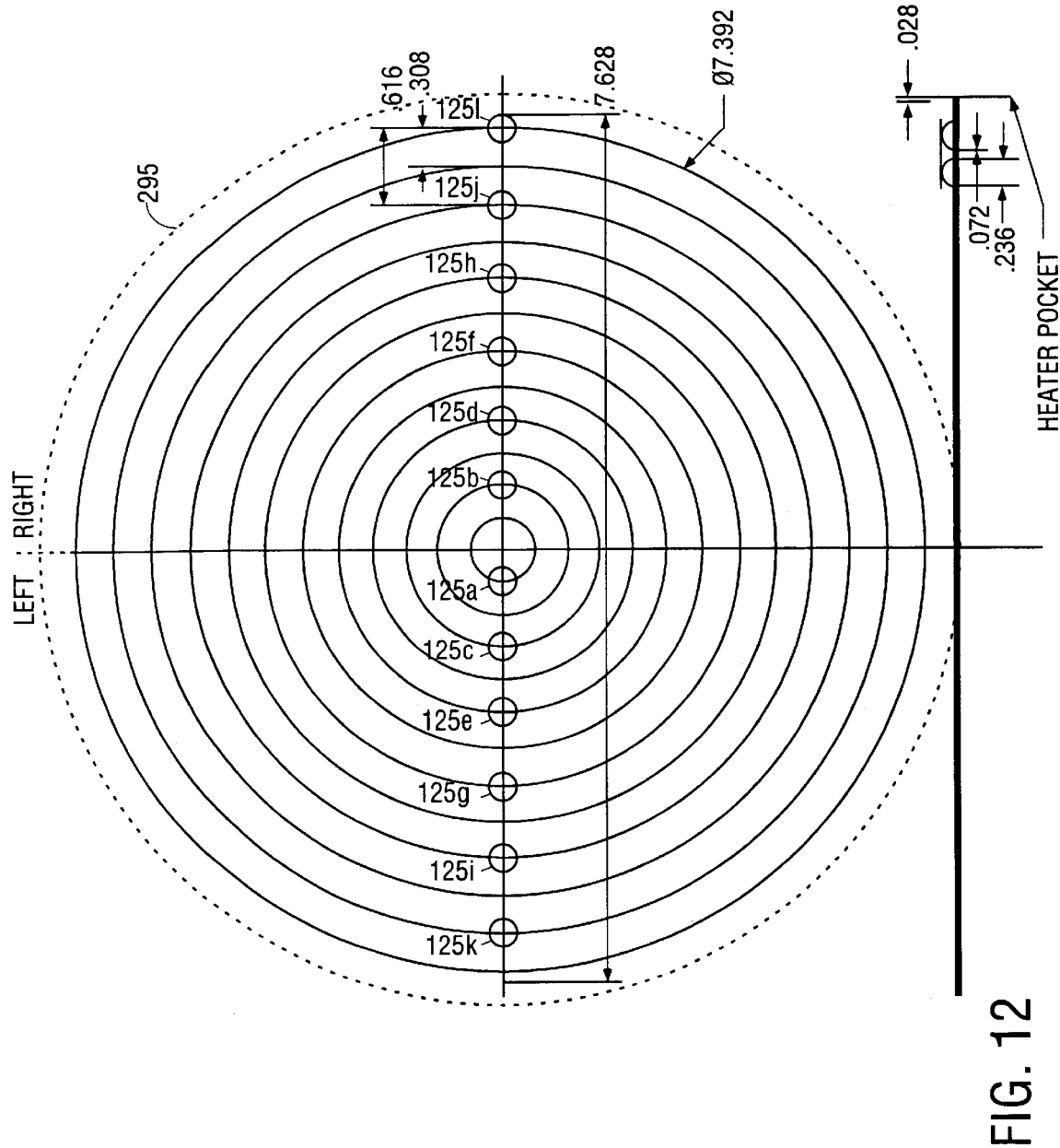
FIG. 12 is a schematic illustration of one temperature measurement capability of each of twelve temperature sensors of the reaction chamber of FIG. 1.

FIG. 12 is a schematic illustration of the temperature sensing pattern of pyrometers 125 described above. In one embodiment, pyrometers 125 are aligned in a row. Pyrometers 125 are spaced to measure a temperature on a wafer approximately 0.616 inches apart. Pyrometers 125 are configured, however, such that when heater 180 is rotated (e.g., 360°), measurements are collected, in this embodiment, at points (e.g., at sampling points associated with different arc angles) representing concentric circles about a wafer placed on the stage approximately one-half the distance between adjacent pyrometers. This is achieved by alternately positioning pyrometers 125 in chamber body 120 through an axis corresponding with the bisection of a wafer. In FIG. 12, eight-inch wafer 295 positioned within pocket 250 of stage or susceptor 285 is shown in dashed lines. Pyrometer 125a is positioned approximately at a radius of 0.308 inches on the left side of an axis corresponding with an axis of wafer 295. Pyrometer 125b is positioned at a radius of approximately 0.616 inches to the right from an axis corresponding with an axis bisecting wafer 295. Pyrometer 125c is positioned approximately 0.616 inches from pyrometer 125a on the left side of the axis bisection. Pyrometer 125d is positioned approximately 0.616 inches from pyrometer 125b on the right side of wafer 295. A similar pattern is utilized for pyrometers 125e, 125f, 125g, 125h, 125i, 125j, 125k, and 125l. Collectively, pyrometers 125 measure a concentric circle every 0.308 inches about the area of a wafer for a circular wafer having a diameter of approximately 8 inches. Pyrometers 125 are positioned to measure each 0.308 inches of radius of wafer 295 to a total of 7.628 inches. Each pyrometer measures a substantially circular area having a diameter of 0.236 inches and each measured area is separated by 0.072 inches.

As is illustrated by FIG. 12, pyrometers 125 provide a detailed measurement of a processing temperature about wafer 295 by utilizing a plurality of pyrometers spaced at a minimum distance from one another. In this manner, pyrometers 125 offer temperature measurements at a plurality of points about a surface of wafer 295. Specifically, in this embodiment, pyrometers 125 measure the temperature of wafer 295 according to points associated with 12 concentric circles with each temperature measurement stepped in radius by 0.308 inches about the wafer. This information may be used to evaluate the heating capability of a resistive heater utilized, for example, in a CVD processing chamber. Ideally, the temperature measured by each pyrometer at a plurality of points of various rotation angles (e.g., 0°, 12°, 30°, . . . , 360°) is linear. Ideally also, the temperature measured by each pyrometer, in one embodiment, is the same.

One advantage of pyrometers as the measurement tool of the wafer temperature over other forms of temperature measurement is that pyrometers can be tuned to measure the temperature of a wafer as opposed to also collecting measurements of the temperature of the heater. In general, pyrometers function by measuring a thermal radiation of an object. Pyrometers may be tuned to measure the thermal radiation at a wavelength range that a semiconductor wafer yields at temperatures of 700° C. or more. For example, a typical silicon wafer emits thermal radiation at temperatures of 700° C. or more in the wavelength range of 870–930 nanometers (nm). An aluminum nitride (AlN) heater stage at the same temperature generally emits thermal radiation at wavelengths outside the wavelength range of silicon (e.g., at wavelengths greater than 930 nm). Thus, pyrometers offer the ability to be tuned to measure those wavelengths associated with the desired object (i.e., wafer) at the exclusion of undesired objects (i.e., heater).

It is to be appreciated that temperature sensors other than pyrometers may be used in the system of the invention. In the application described where temperature measurement of a wafer is very important, pyrometers offer more advantages than thermal cameras or thermocouples (including discrete object measurement). Nevertheless, in other applications or where other objectives dictate, other temperature sensors including thermal cameras or thermocouples are similarly suitable.

Figure 13:
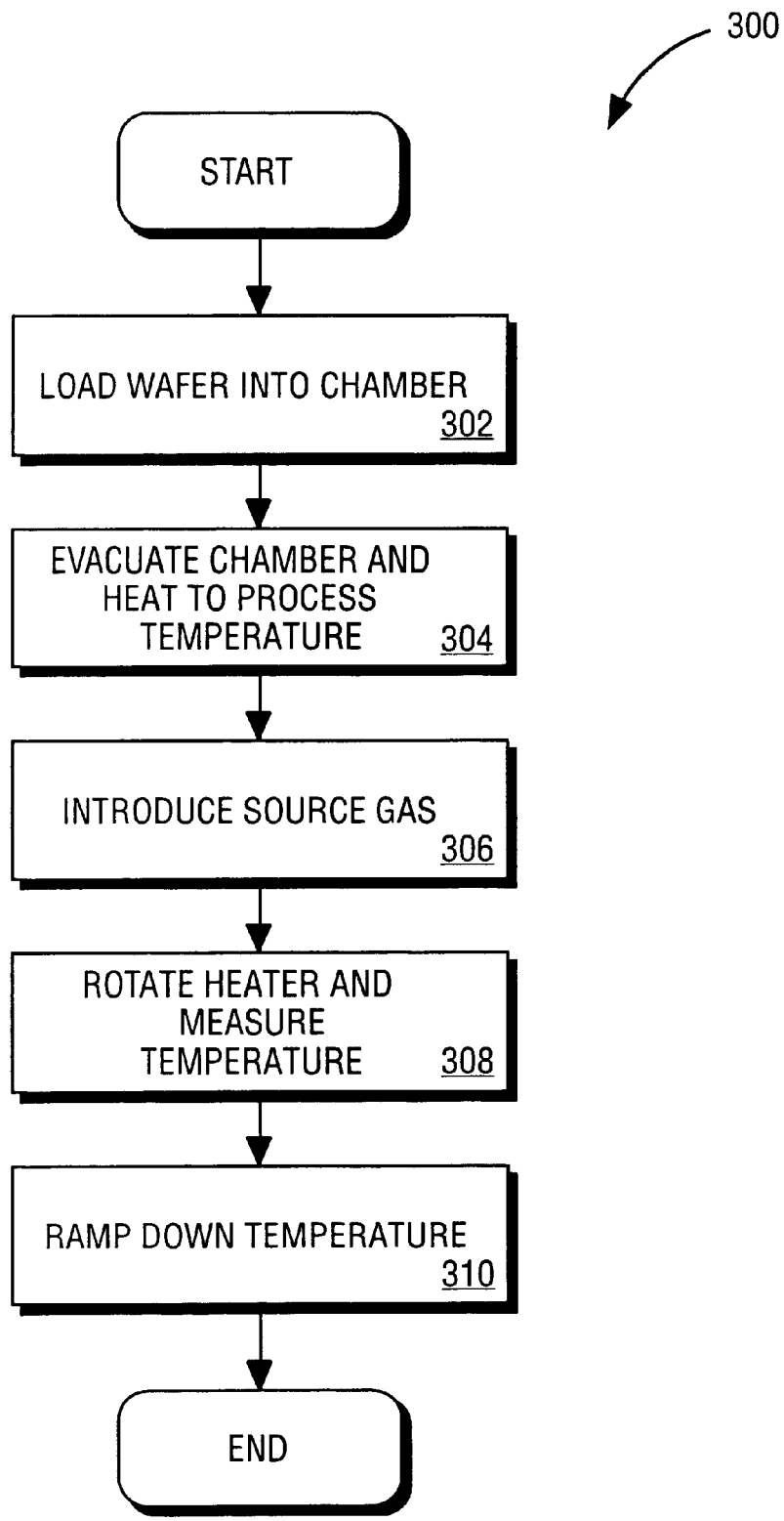
FIG. 13 is a block diagram of a process for evaluating a heater in accordance with an embodiment of the invention.

FIG. 13 describes a general method of evaluating a resistive heater such as a multi-zone resistive heater in a reactor or processing chamber configured according to an embodiment of the invention. Method 300 begins by loading a wafer, such as a conventional eight-inch diameter wafer into a processing chamber such as processing chamber 100 (block 302). Chamber volume 170 is then evacuated to a suitable pressure such as a pressure contemplated for the processing of a wafer in a film-formation process. In other words, chamber volume 170 is evacuated to a desired process pressure. At this time, the wafer and stage 185 are suitably heated to a reaction temperature (block 304). Process gas, such as, in this embodiment, an inert process gas (e.g., nitrogen), is introduced through inlet 200 through blocker plate 205 and distributed over the wafer via face plate 210 (block 306). At the same time, a purge gas (e.g., nitrogen) is introduced into an inferior portion of chamber volume 170. The introduction of process gas, in one embodiment, contributes to simulate chamber reaction conditions (e.g., chamber pressure) desirable in a film-formation processing chamber. Since the process gas that is introduced in this embodiment is inert, no film-formation will result by the contact of the process gas with the wafer. To maintain the desired process parameters, the vacuum pump is activated to generate a vacuum pressure within channel 230 thereby drawing the process gas and purge gas out of chamber volume 170 through holes 255 of pumping plate 215.

Once the process parameters (e.g., temperature and pressure) are set to simulate desired process parameter for a film-formation process, heater 180 is rotated 360°. During the rotation, temperature measurements are collected by pyrometers 125 (block 308). Once heater 180 is rotated 360° and data is gathered by pyrometers 125, the temperature in chamber volume 170 is ramped down by reducing the power supply to the resistive heater 180 and the vacuum is released (block 310). Once ramped down is complete, chamber lid 120 may be lifted to expose and remove the wafer inside processing chamber 100.

Figure 14:
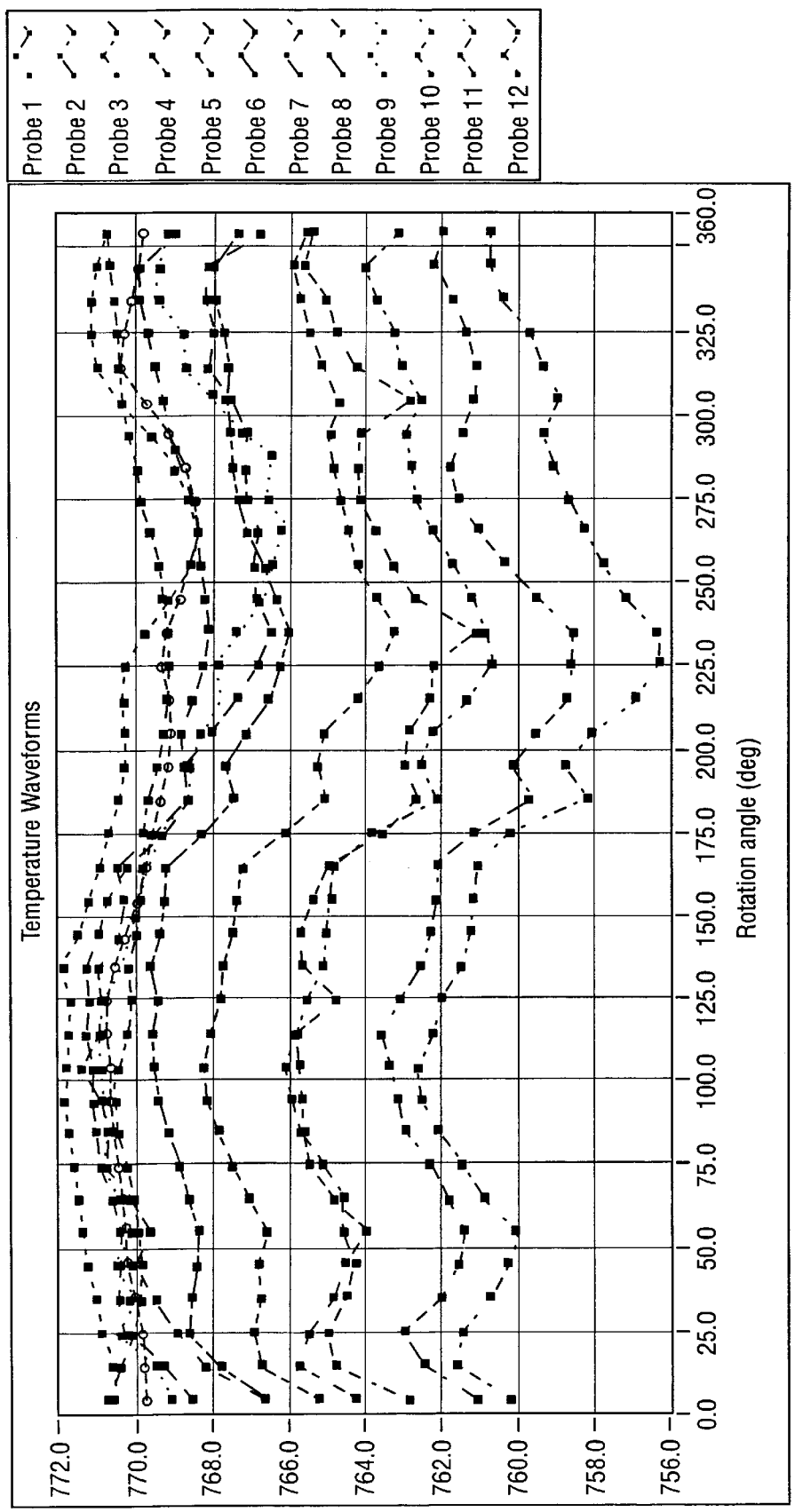
FIG. 14 shows a first plot of temperature measurements measured about a circumference of a wafer on the surface of a heater in accordance with an embodiment of the invention.
Figure 15:
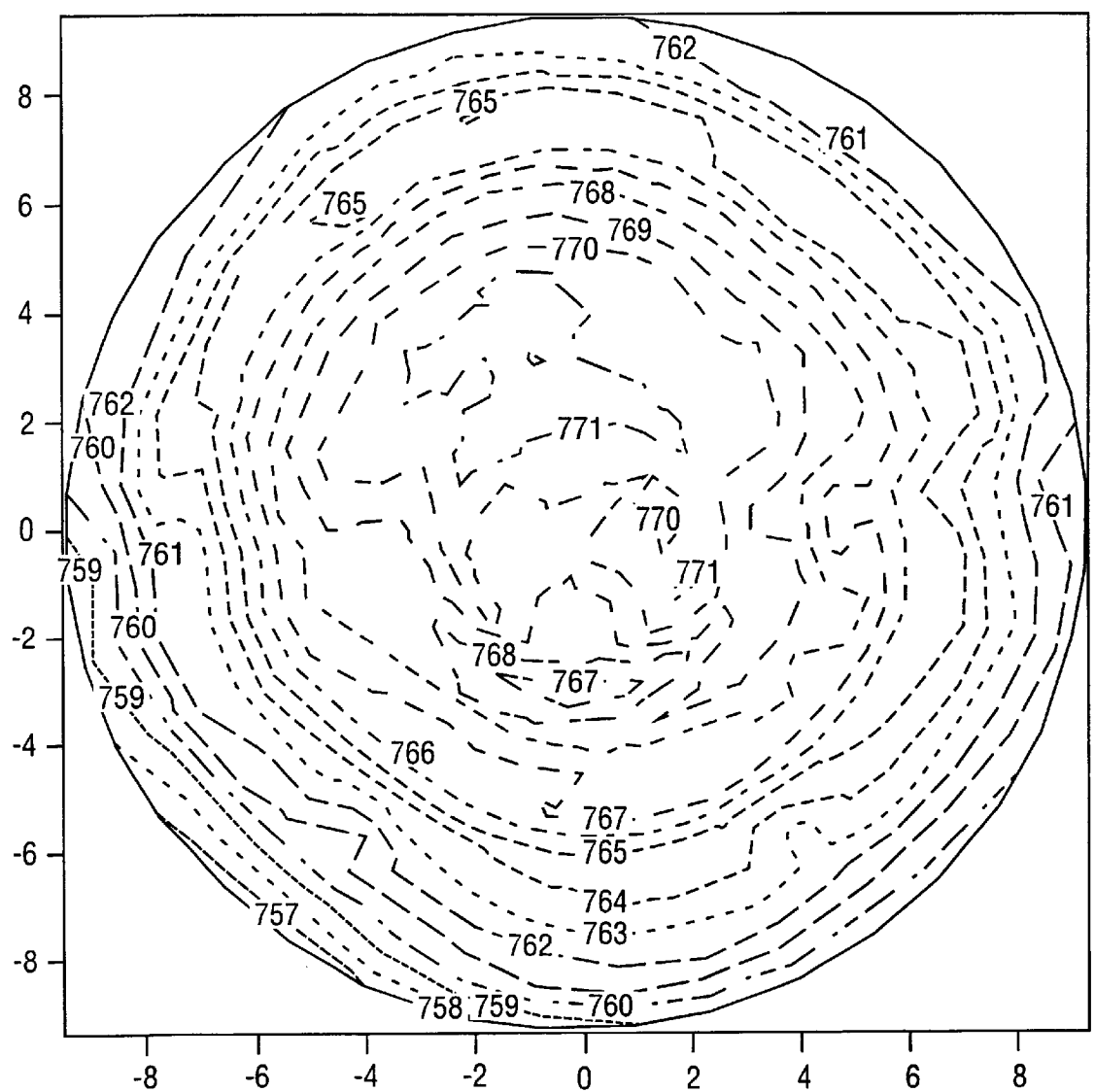
FIG. 15 shows a temperature map of a wafer with the data points collected in FIG. 14.

FIGS. 14–17 show representative data evaluating a multi-zone resistive heater such as described above according to the method of the invention and utilizing the system of the invention at two different power ratios of the respective heating elements of the tested heater. FIG. 14 shows a plot of 36 data points of temperature measurements measured about a circumference of a wafer on the surface of a susceptor or stage of a resistive heater by 12 individual pyrometers. The data was gathered at a heater temperature of 799.7° C. The power ratio of the heater is 0.80 with an inner heater resistance of 6.275 ohms and an outer heater resistance of 7.724 ohms. FIG. 14 shows that the temperature of the wafer measured by the 12 pyrometers about the wafer varied from a temperature of approximately 756° C. to a temperature of 772° C., a temperature difference of 16° C. The data also shows that at a point commensurate with a rotation of approximately 225°, the temperature of the wafer diminished or sagged. FIG. 15 is a temperature map of the surface of a wafer according to the data obtained in FIG. 14. In general, FIG. 15 shows higher temperatures at the center of the wafer than at the edges.

Figure 16:
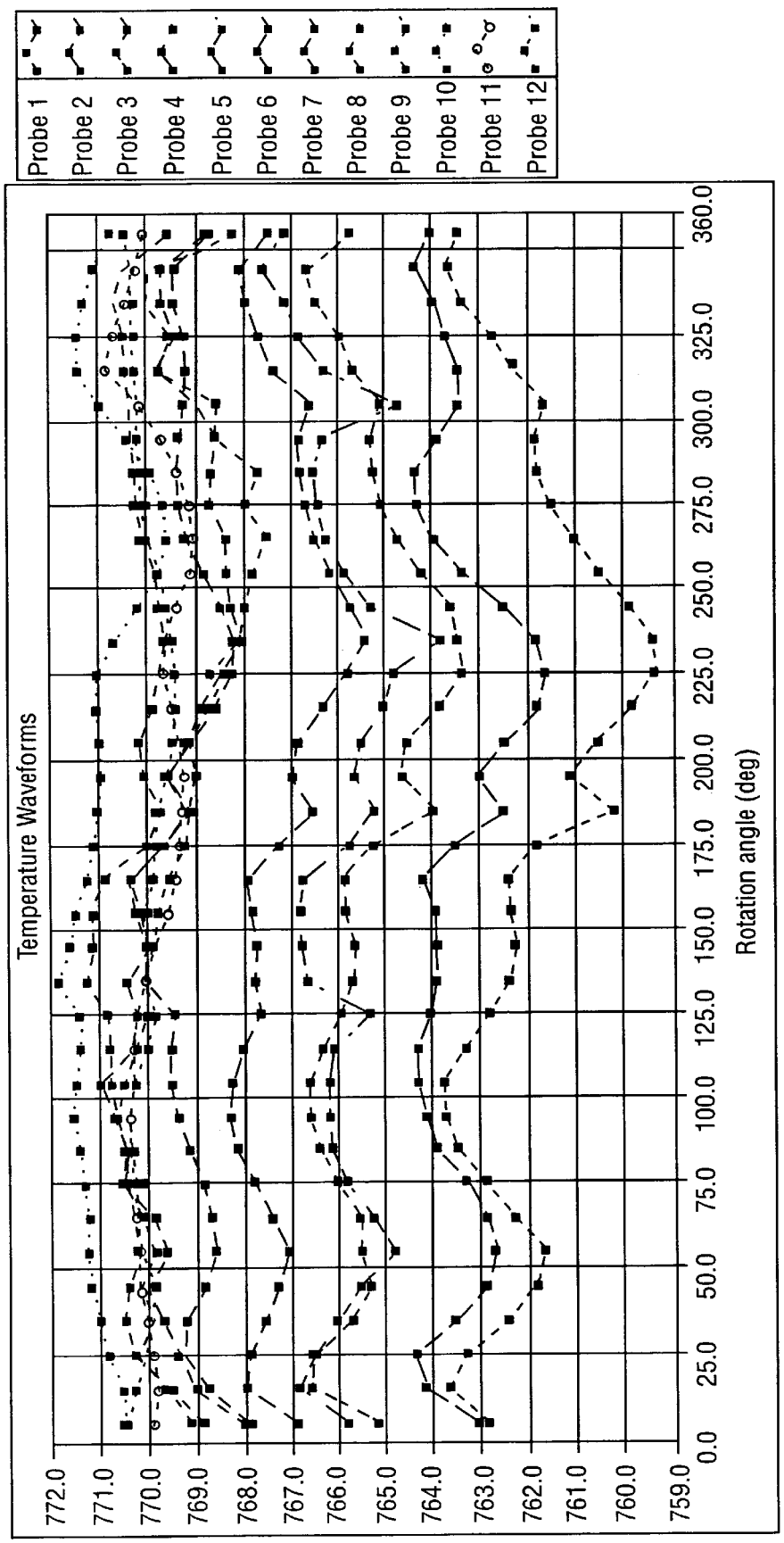
FIG. 16 shows a second plot of temperature measurements measured about a circumference of a wafer on the surface of a heater in accordance with an embodiment of the invention.
Figure 17:
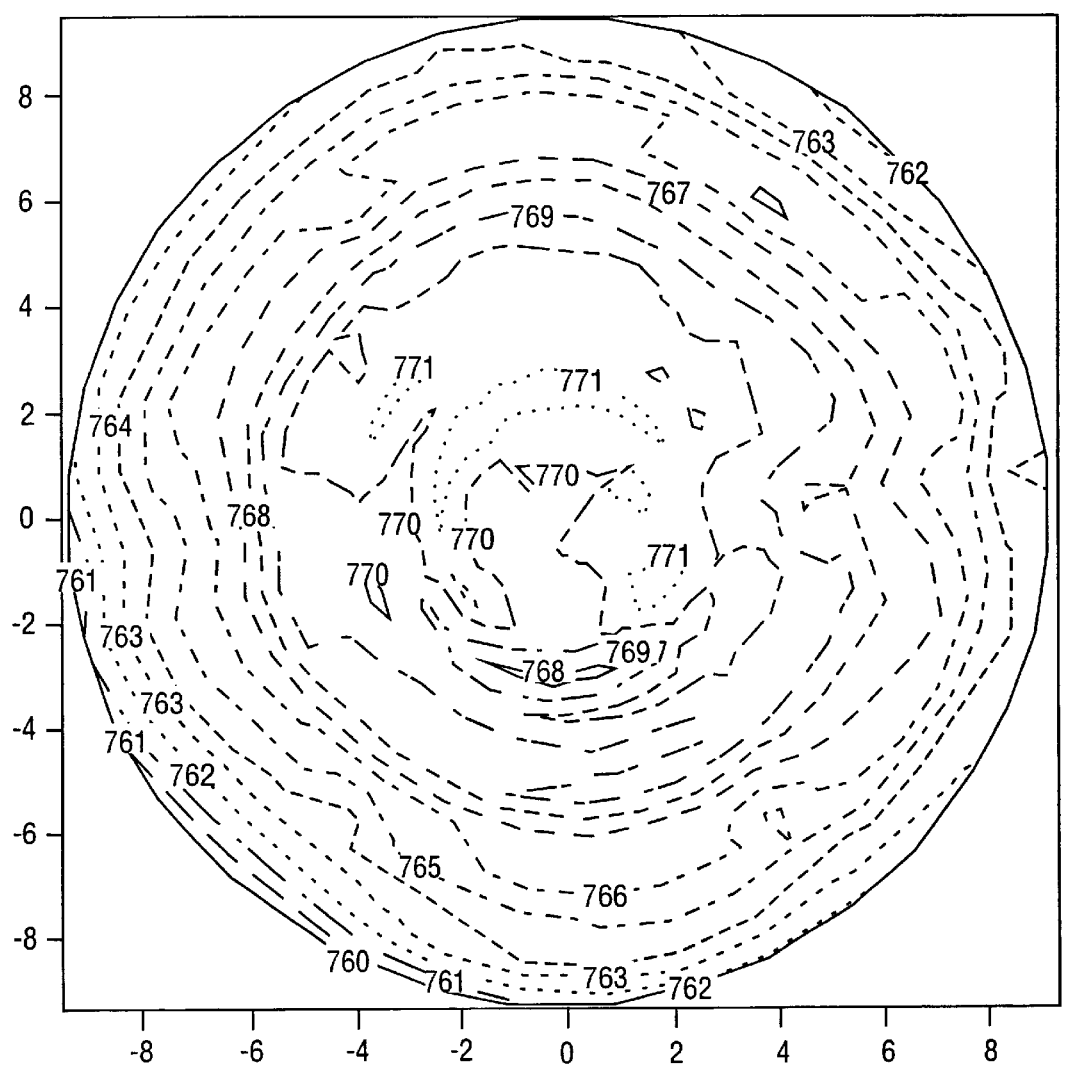
FIG. 17 shows a temperature map of a wafer with the data points collected in FIG. 16.

FIG. 16 shows a second representative example of data collected of temperature of a wafer from the resistive heater evaluated with regard to FIGS. 14–15. In this case, a resistive heater has a temperature of 800° C. The power ratio of the heating element of the multi-zone resistive heater is 1.0 with an inner resistance of 6.330 ohms and an outer resistance of 7.7 ohms. In this example, the temperature of the wafer measured by 12 pyrometers over 36 points representing a circumference of a wafer varies by approximately 13° C. between 759° C. and 772° C. Again, there is a decline or sag in the temperature of the wafer at a rotation angle of approximately 225° C. FIG. 17 shows the temperature map of the data collected in FIG. 16.

The above examples illustrate the use of the invention as a qualification tool to evaluate a resistive heater for use in various processes. In such case, parameters such as heater temperature and power ratio can be evaluated to optimize the performance of the heater under desired processing conditions. Such information allows a process operator to qualify a heater and optimize the process conditions to improve the performance of a desired process.

As can be seen from results measured in FIGS. 14–16, the heaters examined in those instances do not meet a design heating uniformity requirement target of ±2.5° C. units. These results illustrate that the tested heaters require further adjustment or would be unsuitable for strict uniformity guidelines In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
   a chamber;
   a resistive heater disposed within a volume of the chamber comprising a stage having a surface area to support a wafer and a body comprising at least one heating element and a shaft coupled to the body;
   a plurality of temperature sensors each comprising a sensing point coupled to the chamber each configured to measure a temperature at separate points associated with the surface area of the stage, wherein the temperature sensing point of each of the plurality of sensors is disposed adjacent to the stage of the resistive heater; and
   a motor coupled to the shaft and configured to rotate the resistive heater about an axis through the shaft.

2. The apparatus of claim 1, wherein the plurality of temperature sensors are aligned to measure a temperature about concentric circles of the area of the stage.

3. The apparatus of claim 1, further comprising:
   a hub coupled to the heater shaft;
   a first pulley ring coupled to the hub;
   a second pulley ring coupled to the motor; and
   a belt coupled between the first pulley ring and the second pulley ring.

4. The apparatus of claim 3, further comprising:
   a feedthrough comprising a first portion coupled to the hub and surrounding a portion of the shaft and adapted to rotate with the rotation of the hub; and a second portion coupled to the chamber, wherein the second portion surrounds the first portion and a pressure seal is maintained between the first portion and the second portion.

5. The apparatus of claim 4, further comprising a vacuum source coupled to the chamber, wherein the feedthrough is coupled to the hub such that a pressure less than atmospheric pressure may be established within the chamber.

6. The apparatus of claim 1, further comprising a rotational sensor coupled to the chamber comprising a signal to indicate a revolution of the resistive heater.

7. The apparatus of claim 1, further comprising a positional sensor coupled to the chamber comprising a signal to indicate a reference position for a rotation of the resistive heater.

8. The apparatus of claim 7, further comprising a rotational sensor coupled to the chamber comprising a signal to indicate a revolution of the resistive heater from the reference position.

9. The apparatus of claim 1, wherein the temperature sensors are adapted to remain stationary while the resistive heater rotates.

10. The apparatus of claim 1, wherein a distance from the wafer to the temperature sensors is from 1.5 to 6 millimeters.

11. An apparatus comprising:
a chamber configured to house a substrate for processing;
a resistive heater disposed within a volume of the chamber comprising a stage having a surface area to support a substrate and a body comprising at least one heating element, and a shaft coupled to the body;
a plurality of temperature sensors coupled to the chamber and aligned in a row;
a motor coupled to the shaft and configured to rotate the resistive heater such that each of the plurality of temperature sensors measure a temperature at separate points associated with a circle about the surface area of the stage.

12. The apparatus of claim 11, further comprising:
a first pulley ring coupled to the shaft;
a second pulley ring coupled to the motor; and
a belt coupled between the first pulley ring and the second pulley ring.

13. The apparatus of claim 11, further comprising a positional sensor coupled to the chamber comprising a signal to indicate a reference position for a rotation of the resistive heater.

14. The apparatus of claim 13, further comprising a rotational sensor coupled to the chamber comprising a signal to indicate a revolution of the resistive heater from the reference position.

15. The apparatus of claim 11, wherein the temperature sensors are disposed adjacent to the stage of the resistive heater.

16. The apparatus of claim 11, wherein the temperature sensors are adapted to remain stationary while the resistive heater rotates.

17. The apparatus of claim 11, wherein a distance from the surface area of the stage of the resistive heater to the temperature sensors is from 1.5 to 6 millimeters.

18. A system comprising:
a chamber configured to house a substrate for processing:
a resistive heater disposed within a volume of the chamber comprising a stage having a surface area to support a wafer and a body comprising at least one heating element and a shaft coupled to the body;
a plurality of temperature sensors each comprising a sensing point coupled to the chamber each configured to measure a temperature at separate points associated with the surface area of the stage, wherein the temperature sensing point of each of the plurality of sensors is disposed adjacent to the stage of the resistive heater;
a controller coupled to the plurality of temperature sensors; and
a memory coupled to the controller comprising an area for storing measurement data generated by the plurality of temperature sensors.

19. The system of claim 18, wherein the memory comprises a computer-readable medium having a computer program embodied therein for directing operation of the system, the computer-readable program comprising instructions for measurement sampling by the plurality of temperature sensors.

20. The system of claim 19, wherein the plurality of temperature sensors are aligned in a row to measure a temperature about concentric circles of the area of the stage.

21. The system of claim 18, further comprising:
a motor coupled to the shaft; and
a positional sensor coupled to the chamber comprising a position signal to indicate a reference position for a rotation of the resistive heater by the motor, wherein the controller comprises system logic to control the motor according to the position signal.

22. The system of claim 21, wherein the system logic to control the motor according to the position signal comprises instructions to engage the motor to rotate the resistive heater in one direction from the reference position.

23. The system of claim 22, further comprising:
a rotational sensor coupled to the chamber comprising a revolution signal to indicate a revolution of the resistive heater from the reference position, wherein the controller comprises system logic to engage the motor to rotate the resistive heater in an opposite direction in response to the revolution signal.

24. The system of claim 18, wherein the temperature sensors are adapted to remain stationary while the resistive heater rotates.

25. The system of claim 18, wherein a distance from the wafer to the temperature sensors is from 1.5 to 6 millimeters.

* * * * *